United States Patent
Yamada et al.

(10) Patent No.: US 6,847,665 B2
(45) Date of Patent: Jan. 25, 2005

(54) SEMICONDUCTOR LASER DEVICE AND METHOD FOR PRODUCING THE SAME

(75) Inventors: Shigehiro Yamada, Yamatokooriyama (JP); Kazuhiro Tsuchida, Nara-ken (JP); Katsushige Masui, Nara (JP); Toshiya Nagahama, Kashiba (JP); Takahide Ishiguro, Nabari (JP); Naotaka Ohtsuka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 156 days.

(21) Appl. No.: 10/101,696

(22) Filed: Mar. 21, 2002

(65) Prior Publication Data

US 2002/0141465 A1 Oct. 3, 2002

(30) Foreign Application Priority Data

Mar. 21, 2001 (JP) .......................... 2001-080585
Jan. 25, 2002 (JP) .......................... 2002-017164

(51) Int. Cl.[7] .............................................. H01S 3/00
(52) U.S. Cl. ................... 372/38.08; 372/38.01
(58) Field of Search ...................... 372/38.01, 38.02, 372/38.08, 36, 43, 48

(56) References Cited

U.S. PATENT DOCUMENTS

| | | | | |
|---|---|---|---|---|
| 5,500,867 A | * | 3/1996 | Krasulick | 372/38.02 |
| 5,610,395 A | * | 3/1997 | Nishiyama | 250/239 |
| 5,974,066 A | * | 10/1999 | Wu et al. | 372/43 |
| 2001/0034479 A1 | * | 10/2001 | Ring et al. | 600/322 |
| 2002/0064198 A1 | * | 5/2002 | Koizumi | 372/48 |

FOREIGN PATENT DOCUMENTS

| | | |
|---|---|---|
| JP | 10-214437 | 8/1998 |
| JP | 2000-77765 | 3/2000 |

* cited by examiner

Primary Examiner—Don Wong
Assistant Examiner—Hung Tran Vy
(74) Attorney, Agent, or Firm—Morrison & Foerster LLP (57) ABSTRACT

Not only a semiconductor laser element and a photodetector but also a capacitor connected to the photodetector is housed in a package to thereby reduce the distance from the capacitor to the photodetector so that power source noise is efficiently suppressed by the capacitor and a power source noise suppression effect is improved.

15 Claims, 7 Drawing Sheets

_SEMICONDUCTOR LASER DEVICE AND METHOD FOR PRODUCING THE SAME_

BACKGROUND OF THE INVENTION

The present invention relates to a semiconductor laser device and a method for producing the same.

Figure 8A:
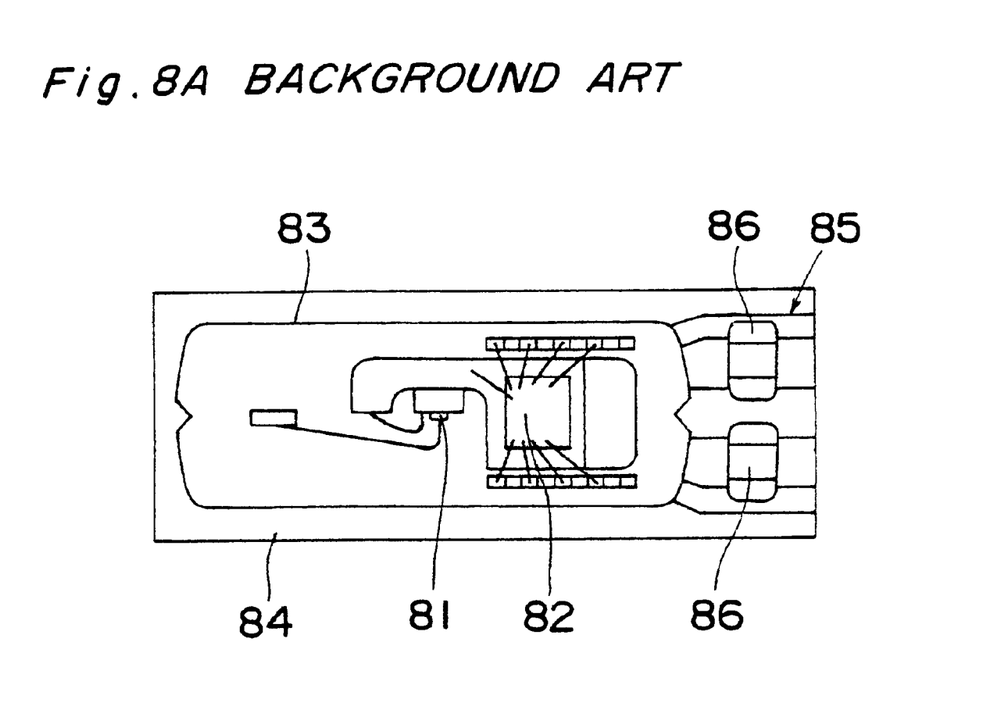
FIG. 8A is a schematic top plan view of the conventional semiconductor laser device.
Figure 8B:
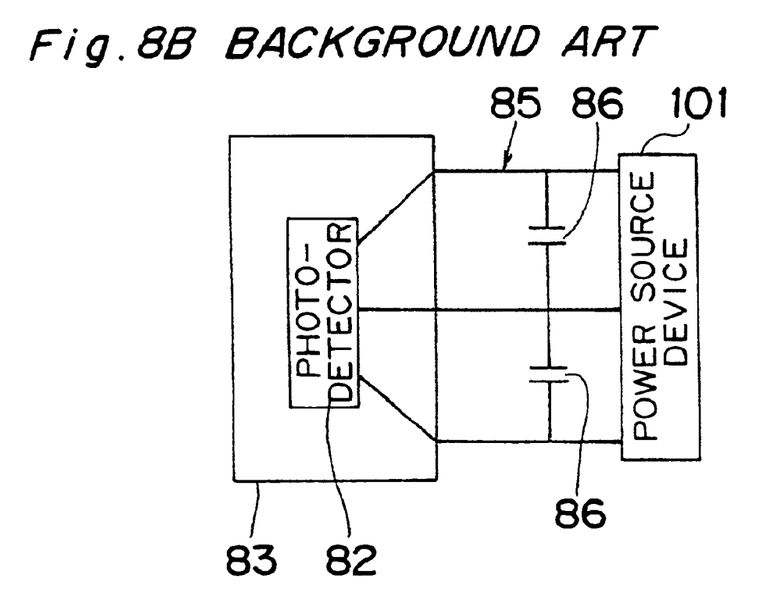
FIG. 8B is an equivalent circuit diagram of the conventional semiconductor laser device.

FIG. 8A is a schematic top plan view of a conventional semiconductor laser device, and FIG. 8B is an equivalent circuit diagram of the semiconductor laser device of FIG. 8A. The conventional semiconductor laser device has, as shown in FIG. 8A, a semiconductor laser element 81, a photodetector 82, and a package 83 housing them, the components being mounted onto a wiring board 84. The wiring board 84 has a wiring pattern 85, and capacitors 86 for suppressing power source noise are arranged on the wiring pattern 85. Further, fixation of the capacitors 86 is performed with the use of soldering and so on.

As shown in FIG. 8B, in the semiconductor laser device with the above constitution, a power source device 101 outside of the package 83 supplies electric energy to the photodetector 82 through wirings of the wiring pattern 85. At this time, the capacitors 86 suppress noise from the power source device 101 from being amplified by an internal circuit of the photodetector 82 so much that the amplified noise would appear as oscillation in an output signal of the photodetector 82. That is, an increase in the oscillation level of the light-emitting element 82 is suppressed by the capacitors 86.

However, since the capacitors 86 are disposed outside of the package 83, the distance between the photodetector 82 and the capacitors 86 is as long as 10 mm–20 mm, resulting in a problem in that the power source noise suppression effect is reduced or attenuated.

Further, it is required to provide the wiring board 84 with a space for the capacitors 86, and thus there is a problem that the wiring pattern 85 has little freedom of design.

SUMMARY OF THE INVENTION

An object of the present invention is to provide a semiconductor laser device and a method for producing the same, the semiconductor laser device being capable of improving the power source noise suppression effect and also expanding the degree of freedom of design of the wiring pattern of a wiring board used for the device.

In order to accomplish the above object, a semiconductor laser device according to an aspect of the present invention comprises:

a semiconductor laser element;

a photodetector;

a capacitor electrically connected to the photodetector; and a package housing the semiconductor laser element, the photodetector and the capacitor.

With the above constitution, since the capacitor is housed within the package, the distance from the capacitor to the photodetector can be reduced. Therefore, power source noise is efficiently suppressed by the capacitor, thus making it possible to improve the power source noise suppression effect.

Also, since the capacitor is housed in the package, it is not required to place the capacitor for suppressing the power source noise on, for example, a wiring board. This makes it possible to expand the degree of freedom of design of the wiring pattern of the wiring board.

In one embodiment, the photodetector is die bonded to a first die bonding surface of a mounting portion provided within the package. The capacitor is a wire-bondable chip capacitor, and is die bonded to a second die bonding surface of the mounting portion. The first die bonding surface and the second die bonding surface are substantially parallel to each other.

In the embodiment, because the first die bonding surface to which the photodetector is die bonded and the second die bonding surface to which the capacitor is die bonded are substantially parallel to each other, it is possible to arrange the capacitor and the photodetector in the same direction, which facilitates die bonding and wire bonding of them.

In one embodiment, a lead pin is provided within the package and in proximity of the mounting portion. The photodetector, the capacitor and the lead pin have respective wire bonding surfaces; the wire bonding surfaces of the photodetector, the capacitor, and the lead pin are substantially parallel to one another, and the wire bonding surface of the capacitor is located between the wire bonding surface of the photodetector and the wire bonding surface of the lead pin.

With this structure, because the wire bonding surfaces of the photodetector, the capacitor and the lead pins are substantially parallel to one another, and the wire bonding surface of the capacitor is located between the wire bonding surface of the photodetector and the wire bonding surface of the lead pin, there is no difficulty in performing wire bonding between the wire bonding surface of the photodetector and the wire bonding surface of the capacitor, and between the wire bonding surface of the capacitor and the wire bonding surface of the lead pin. This makes it possible to improve the productivity.

In one embodiment, the first die bonding surface is a top surface of the mounting portion and the second die bonding surface is an intermediate surface located between the top surface of the mounting portion and a bottom surface of the mounting portion.

With the above arrangement, in the case where the capacitor is die bonded using, for example, an Ag paste and then the photodetector is die bonded using, for example, a resinous adhesive, the Ag paste does not flow from the second die bonding surface, which is the intermediate surface, to the first die bonding surface, which is the top surface of the mounting portion. Accordingly, the first die bonding surface is not contaminated with the Ag paste and the photodetector is favorably die bonded to the first die bonding surface.

In one embodiment, the semiconductor laser element is die bonded to a die bonding surface of a submount fixed to the mounting portion, and the mounting portion has a surface that is substantially coplanar with the die bonding surface of the submount.

With the above arrangement, since the die bonding surface of the submount and the surface of the mounting portion are substantially coplanar with each other, wire bonding for connecting the die bonding surface of the submount to the surface of the mounting portion is easily performed, thus making it possible to improve the productivity.

A method for producing the above semiconductor laser device according to the present invention comprises:

die bonding the capacitor to the second die bonding surface of the mounting portion with an Ag paste; and die bonding the photodetector to the first die bonding surface of the mounting portion with a resinous adhesive.

In one embodiment, the die bonding of the photodetector is performed after the die bonding of the capacitor.

Furthermore, a semiconductor laser device according to another aspect of the present invention comprises:

a metal block mounted with a laser chip;

leads to serve as electrodes;

a resin block though which the metal block and the leads are integrated into an electrode block; and a capacitor electrically directly connected to the leads.

With this arrangement, in the case where an OPIC (optical integrated circuit), for example, is fitted to the metal block, because the capacitor is electrically connected directly to the leads, the distance from the capacitor to the OPIC is short. Therefore, the capacitor efficiently suppresses the power source noise, thereby making it possible to improve the power source noise suppression effect.

Further, since the capacitor is electrically connected directly to the leads, it is not required to place a capacitor for suppressing the power source noise on, for example, a wiring board to be connected to the leads. Therefore, it is possible to expand the degree of freedom of design of the wiring pattern of the wiring board.

Also, since it is not required to arrange the capacitors on the wiring board, the number of components to be fitted to the wiring board can be decreased.

In the case where the operation speed of the OPIC is increased, the power consumption of the OPIC also increases. However, since the distance from the capacitor to the OPIC is short, the power source voltage of the OPIC is stably maintained, making it possible to prevent the OPIC from becoming unstable. That is, even if the operation speed of the OPIC is increased, the OPIC is allowed to operate stably.

Also, even if the operating voltage of the OPIC is reduced, the operation of the OPIC is prevented from becoming unstable because the distance from the capacitor to the OPIC is short and the OPIC is therefore hardly affected by variations in the load.

Further, since the distance from the capacitor to the OPIC is short, it is not required to make the capacitor have a large capacitance. Accordingly, with the capacitance of the capacitor reduced, it is possible to reduce the production cost.

In one embodiment, the capacitor is coated with a resin to be embedded in the resin.

In this embodiment, since the capacitor is embedded in the resin, there is little possibility that the capacitor is broken and/or detached from the leads by external force is lowered. As a result, the following improvements can be realized simultaneously: an improvement in the production yield; an improvement in the workability attributable to the fact that handling becomes easy; and an improvement in the reliability due to the reduced possibility of detachment of the capacitor.

In one embodiment, the capacitor is provided on a side opposite from the laser chip relative to the metal block.

In this embodiment, because the capacitor is provided on the side opposite from the laser chip with respect to the metal block, heat applied at the time of die bonding the laser chip with an Ag paste, for example, is hardly transferred to the capacitor. Therefore, in the case where the capacitor is die bonded to the leads with an Ag paste, the heat-resistant temperature of the Ag paste and that of the capacitor protection-use resin can be lowered, which makes it easy to select materials, and also leads to the cost reduction.

Furthermore, the present invention provides a method for producing a semiconductor laser device, the semiconductor laser device having an electrode block constructed by integrating a metal block mounted with a laser chip, and a lead to serve as an electrode through a resin block. The method comprises:

forming the resin block with a hollow portion to expose the lead;

placing a capacitor in the hollow portion and bonding the capacitor to the lead with an Ag paste; and coating the capacitor with a resin to thereby embed the capacitor in the resin.

Also, the present invention provides a method for producing a semiconductor laser device, comprising:

preparing an electrode block wherein a metal block mounted with a laser chip is integrated with leads through a resin block, the resin block being formed with a hollow portion exposing some of the leads;

placing a capacitor in the hollow portion and bonding the capacitor to the exposed leads with an Ag paste; and coating the capacitor with a resin to thereby embed the capacitor in the resin.

According to both the methods, the capacitor is housed in the hollow portion exposing the leads, and the capacitor is bonded to the exposed leads with the Ag paste. Therefore, it is possible to prevent the Ag paste from spreading out when the Ag paste is applied or after the capacitor is placed in position. Accordingly, it is possible to prevent the Ag paste from being applied to leads to which the Ag paste should not be applied.

A test to confirm whether or not the leads are short-circuited by the Ag paste is required to be conducted only on the leads exposed from the hollow portion. Thus, it is possible to simplify a device for the confirmation.

Furthermore, since the capacitor is coated with the resin, it is possible to improve environmental resistance.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

A semiconductor laser device of the present invention and a method for producing the semiconductor laser device will be hereinafter described in more detail referring to the accompanying drawings.

Figure 1A:
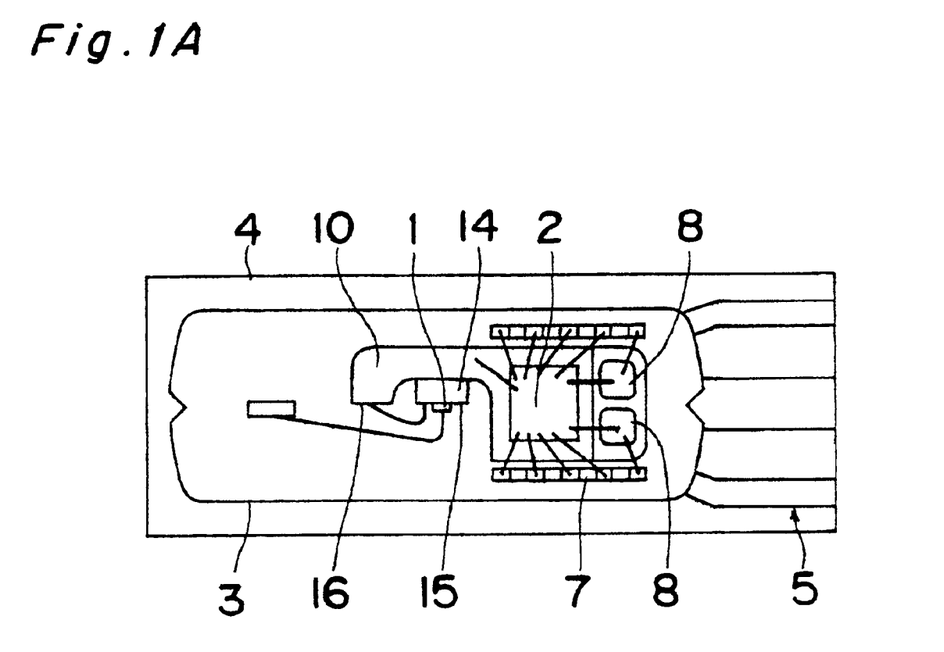
FIG. 1A is a schematic top plan view of one embodiment of the semiconductor laser device of the present invention.
Figure 1B:
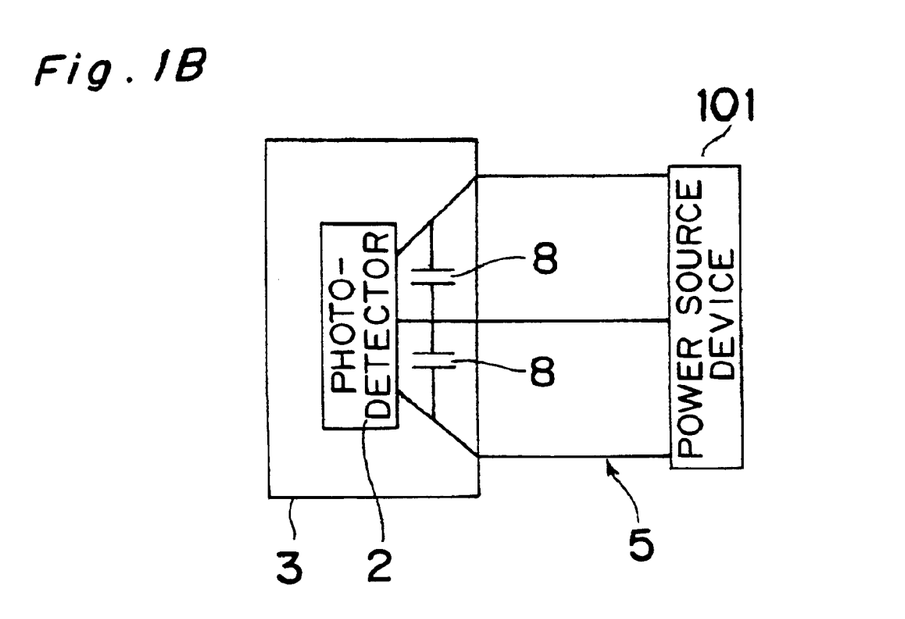
FIG. 1B is an equivalent circuit diagram of the semiconductor laser device shown in FIG. 1A.

FIG. 1A is a schematic top plan view of a semiconductor laser device of one embodiment of the present invention, and FIG. 1B is an equivalent circuit diagram of the semiconductor laser device. Part of a package is omitted from FIG. 1A for the sake of easy understanding. Also, components other than a photodetector and capacitors within the package are omitted from FIG. 1B.

As shown in FIG. 1A, the semiconductor laser device has a semiconductor laser element 1, a photodetector 2, capacitors 8 connected to this photodetector 2, and a package 3 housing the semiconductor laser element 1, the photodetector 2 and the capacitors 8, and is mounted on a wiring board 4 having a wiring pattern 5. A heat sink or heat dissipation plate 10 as a mounting portion is provided within the package 3. One end portion of the heat dissipation plate 10 is formed into a hook shape. A submount 14 is fixed to a side surface of the end portion. The semiconductor laser element 1 is die bonded to a die bonding surface 15 of the submount 14. The die bonding surface 15 of the submount 14 and a tip end surface 16 of the hook-shaped end portion of the heat dissipation plate 10 are coplanar with each other. Lead pins 7 are provided within the package 3 and in the proximity of the other end portion of the heat dissipation plate 10.

As shown in FIG. 1B, the photodetector 2 is connected to a power source device 101 provided outside the package 3 via wirings of the wiring pattern 5. The capacitors 8 are chip capacitors that are wire bondable.

Figure 6:
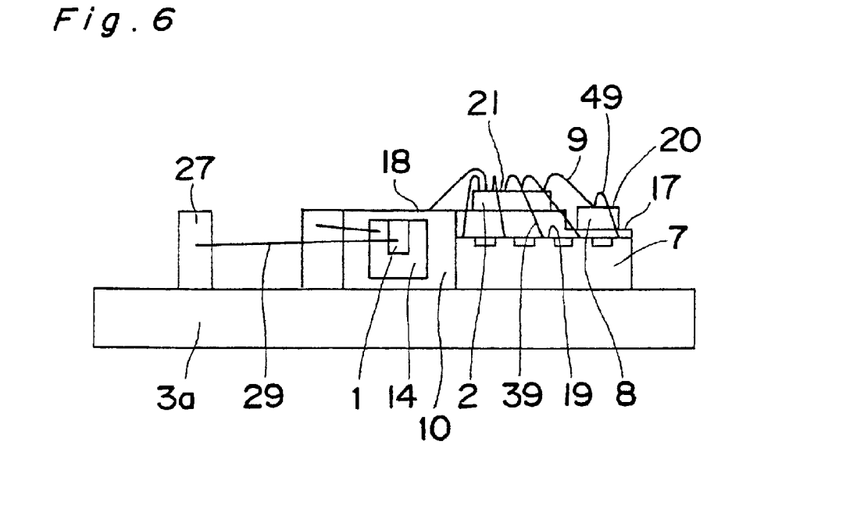

FIG. 6 is a schematic side view of the semiconductor laser device. In FIG. 6, the reference numeral 3a indicates a bottom of the package 3. An upper part, namely, a main part of the package to be fitted to the bottom 3a is omitted from the figure.

As shown in FIG. 6, the photodetector 2 is die bonded to a first die bonding surface 18 that is a top surface of the heat dissipation plate 10. The capacitors 8 are die bonded to a second die-bonding surface 17 that is a surface located between the top surface of the heat dissipation plate 10 and a bottom surface of the heat dissipation plate 10. The first die-bonding surface 18 and the second die-bonding surface 17 are parallel to each other. A wire bonding surface 20 of each capacitor 8, a wire bonding surface 21 of the photodetector 2 and a wire bonding surface 19 of each lead pin 7 are parallel to one another. Furthermore, the wire bonding surfaces 20 of the capacitors 8 are located in a level between the wire bonding surface 21 of the photodetector 2 and the wire bonding surfaces 19 of the lead pins 7.

Figure 7:
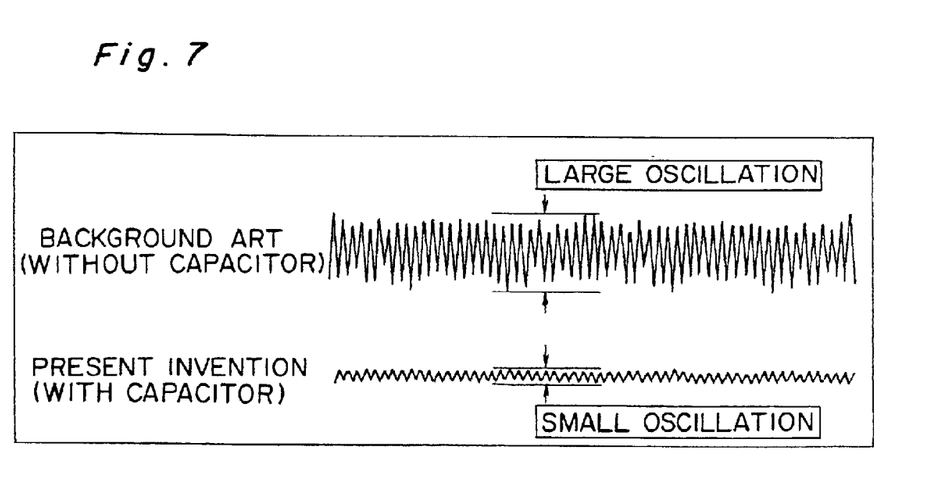
FIG. 7 is a graphical representation of the magnitude of oscillation of this invention compared with the prior art.

In the semiconductor laser device having the above constitution, since the capacitors 8 are housed in the package 3, it is possible to decrease a distance from the capacitors 8 to the photodetector 2 (namely, a distance, d, between facing surfaces of the capacitor and the photodetector. See FIG. 5). Specifically, the distance, d, between the capacitor 8 and the photodetector 2 is made as short as about 5 mm or less. As a result, as shown in FIG. 7, the magnitude or level of the oscillation was reduced in comparison with that of the conventional background art shown in FIGS. 8A and 8B. This means that the capacitors 8 were able to suppress power source noise efficiently, namely, the power source noise suppression effect was improved.

Because the capacitors 8 for suppressing the power source noise are housed in the package 3, it is no more required to arrange the capacitors on the wiring board 4. Thus, the degree of freedom of design of the wiring pattern 5 on the wiring board 4 can be expanded.

Further, because the first die bonding surface 18 and the second die bonding surface 17 are parallel to each other, it is possible to make the distance, d, from the capacitors 8 to the photodetector 2 extremely short, specifically, 1–2 mm.

A method for producing the semiconductor laser device will be explained below with reference to FIGS. 2–6.

Figure 2:
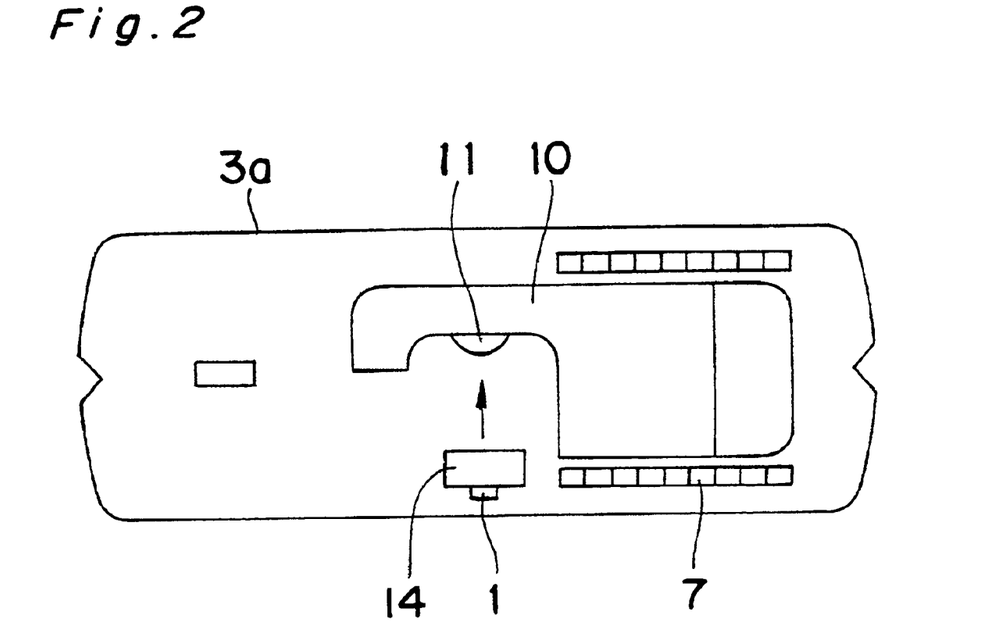
FIG. 2 is a schematic top plan view of the semiconductor laser device in a production process step.

First, as shown in FIG. 2, an Ag paste 11 is applied to a side surface of the hook-shaped end portion of the heat dissipation plate 10, and then the submount 14 on which the semiconductor laser element 1 is mounted is pressed against the side surface of the hook-shaped end portion of the heat dissipation plate 10 to be thereby die bonded thereto.

Figure 3:
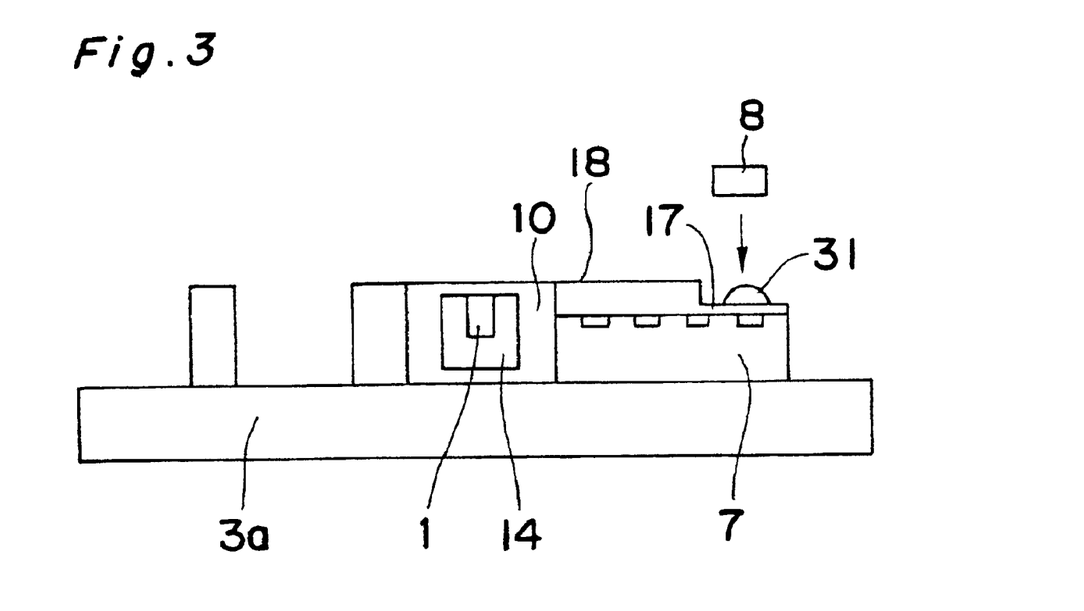
FIGS. 3, 4, 5, and 6 are schematic side views of the semiconductor laser device in different production process steps.

Next, as shown in FIG. 3, an Ag paste 31 is applied to the second die bonding surface 17 of the heat dissipation plate 10, and then the capacitors 8 are pressed against the second die bonding surface 17 of the heat dissipation plate 10 to thereby be die bonded thereto. At this time, the die bonding surface 18 is the top surface of the heat dissipation plate 10, while the second die bonding surface 17 is a surface located between the top surface of the heat dissipation plate 10 and the bottom surface of the heat dissipation plate 10. Therefore, the Ag paste 31 does not flow from the second die bonding surface 17 to the first die bonding surface 18. That is, the first die bonding surface 18 is not contaminated with the Ag paste 31.

Figure 4:
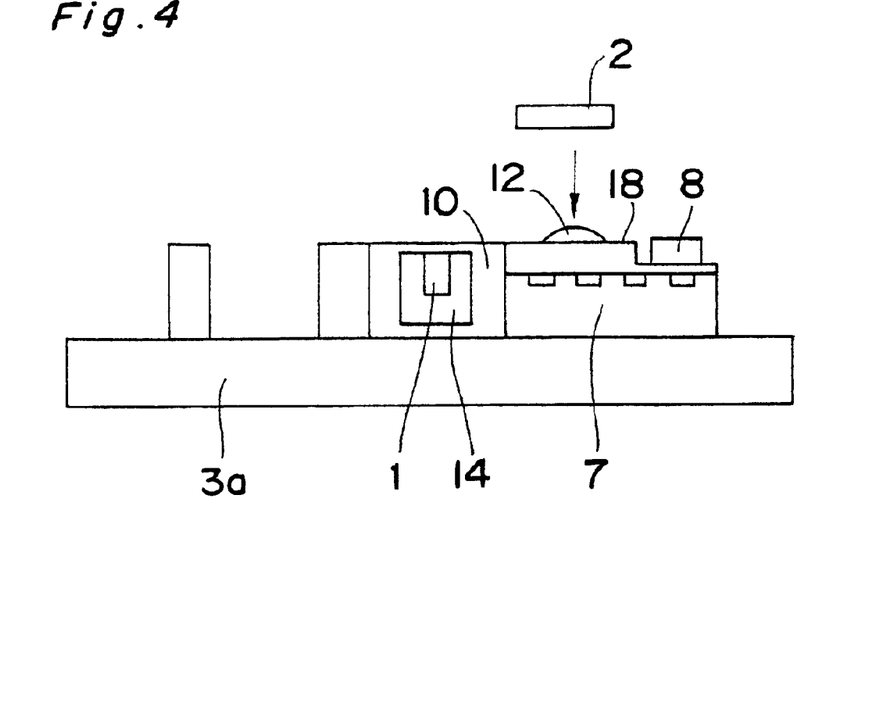

After that, as shown in FIG. 4, a resinous adhesive 12 is applied to the first die bonding surface 18 of the heat dissipation plate 10, and then the photodetector 2 is pressed against the first die bonding surface 18 of the heat dissipation plate 10 to thereby be die bonded thereto.

Figure 5:
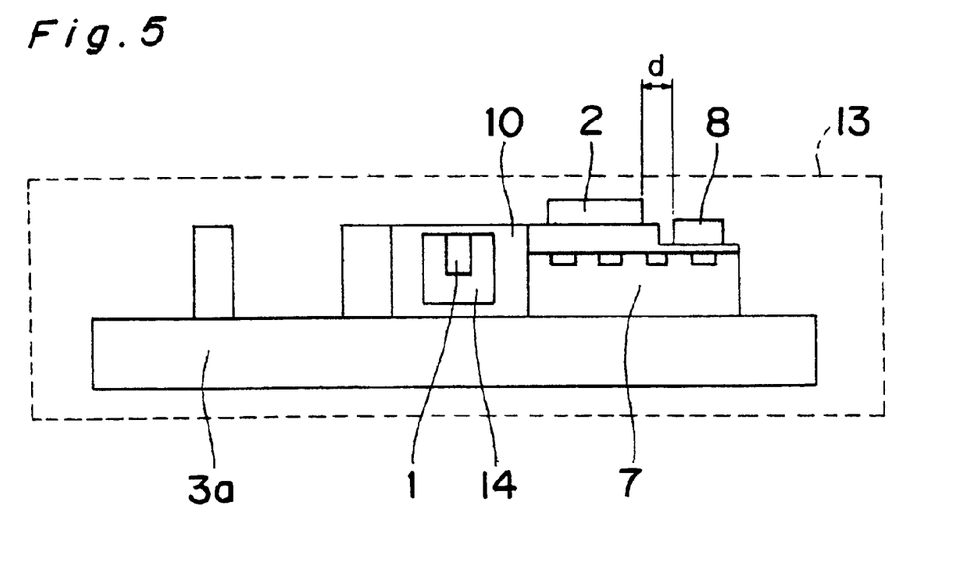

Next, as shown in FIG. 5, in a state where the photodetector 2 is die bonded to the first die bonding surface 18 of the heat dissipation plate 10, the assembly so far fabricated is left within an oven 13 for a fixed period of time to thermoset or harden the resinous adhesive 12.

After completion of the thermosetting of the resinous adhesive 12, wire bonding is performed by a wire bonding apparatus (not shown in the figure). Specifically, as shown in FIG. 6, the semiconductor laser element 1 is wire bonded to a lead pin 27 by a wire 29, the photodetector 2 is wire bonded to the capacitors 8 by wires 9, and the capacitors 8 are wire bonded to the lead pins 7 by wires 49. Together with this, the photodetector 2 is wire bonded to the lead pins 7 by wires 39. At this time, the wire bonding surfaces of the photodetector 2, the capacitors 8, and the lead pins 7 are substantially parallel to one another. Moreover, the wire bonding surfaces 20 of the capacitors 8 are located between the wire bonding surface 21 of the photodetector 2 and the wire bonding surfaces 19 of the lead pins 7 relative to a direction perpendicular to the wire bonding surfaces 20. Thus, there is no difficulty in performing the wire bonding between the wire bonding surface 21 of the photodetector 2 and the wire bonding surfaces 20 of the capacitors 8, and between the wire bonding surfaces 20 of the capacitors 8 and the wire bonding surfaces 19 of the lead pins 7. Therefore, the productivity is improved.

Since the first die bonding surface 18 and the second die bonding surface 17 are parallel to each other, the capacitors 8 and the photodetector 2 can be arranged in the same direction, which makes it possible to perform die bonding and wire bonding of them easily.

Since the photodetector 2 is die bonded to the first die bonding surface 18 which is not contaminated with the Ag paste 31, the Ag paste does not intervene between the photodetector 2 and the first die bonding surface 18. That is, the photodetector 2 is prevented from tilting with respect to the first die bonding surface 18.

Further, since the die bonding surface 15 of the submount 14 and the tip end surface 16 of the hook-shaped end portion of the heat dissipation plate 10 are coplanar with each other, wire bonding for connecting the die bonding surface 15 to the tip end surface 16 can be performed easily, making it possible to improve the productivity.

In the above embodiment, the die bonding surface 15 of the submount 14 and the tip end surface 16 of the hook-shaped end portion of the heat dissipation plate 10 are coplanar with each other, but they may be not exactly but roughly coplanar with each other.

Further, the first die bonding surface 18 and the second die bonding surface 17 are parallel to each other, but they may be not exactly but roughly parallel to each other.

The wire bonding surfaces 20 of the capacitors 8, the wire bonding surface 21 of the photodetector 2 and the wire bonding surfaces 19 of the lead pins 7 are parallel to one another, but they may be not exactly but roughly parallel to one another.

Figure 9:
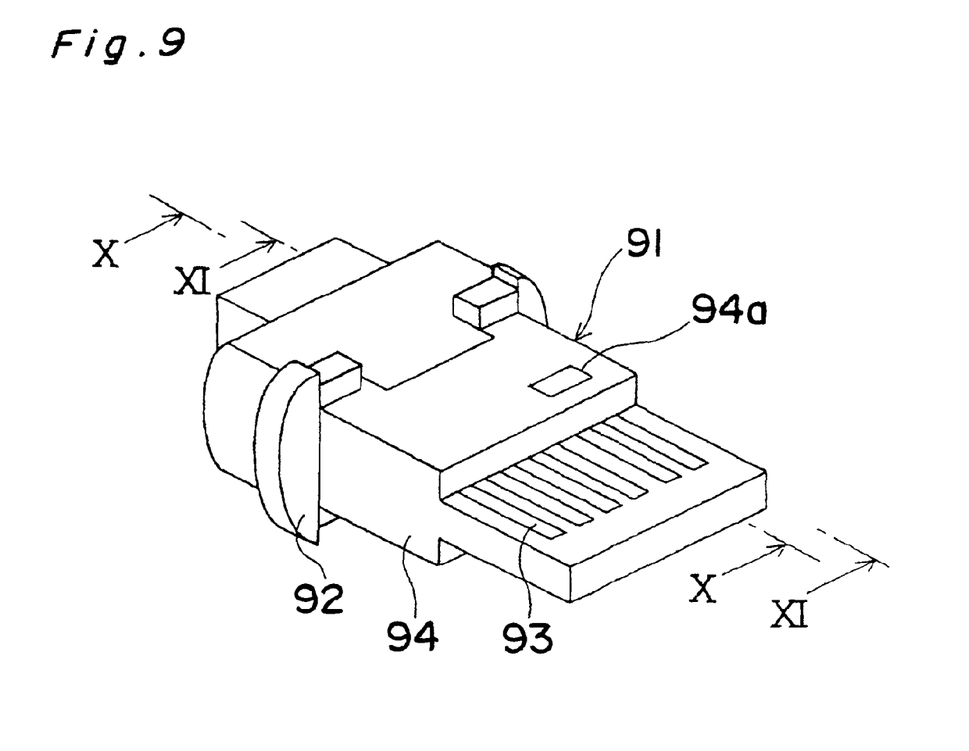
FIG. 9 is a perspective view of a hologram laser as another embodiment of the semiconductor laser device of the present invention.
Figure 10:
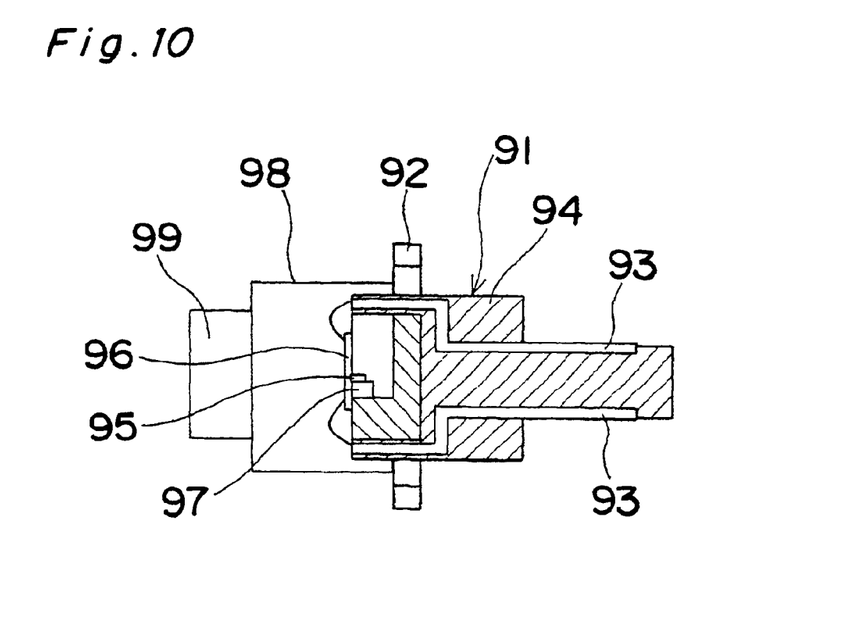
FIG. 10 is a sectional view taken along line X—X of FIG. 9.
Figure 11:
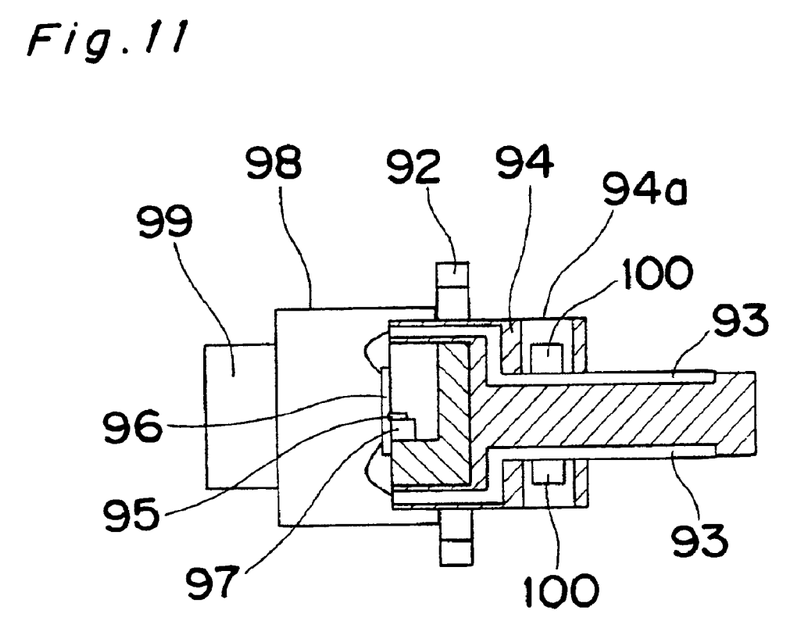
FIG. 11 is a sectional view taken along line XI—XI of FIG. 9.

FIG. 9 is a perspective view of a hologram laser as a semiconductor laser device according to another embodiment of the present invention, FIG. 10 is a sectional view taken along line X—X of FIG. 9, and FIG. 11 is a sectional view taken along line XI—XI of FIG. 9.

As shown in FIG. 9, the hologram laser has an electrode block 91 constructed by integrating a metal block 92 and a plurality of leads 93 serving as electrodes through a resin block 94. The resin block 94 is formed with a hollow portion 94a that exposes the leads 93.

As shown in FIG. 10, the metal block 92 is mounted with an LD (laser diode) chip 95 as a laser chip and an OPIC 96 including a photodetector. The LD chip 95 is fitted to the metal block 92 through a submount 97. Further, the metal block 92 is equipped with a cap 98 to house the LD chip 95 and the OPIC 96. An end portion of the cap 98 on the left side as viewed in the figure (the opposite side from the metal block 92) is fitted with a hologram element 99 in such a manner that the latter is opposed to the LD chip 95.

End portions of the leads 93, 93 on the side of the metal block 92 sandwich the metal block 92, while end portions of the leads 93 on the side opposite from the metal block 92 are exposed from the resin block 94.

Figure 12:
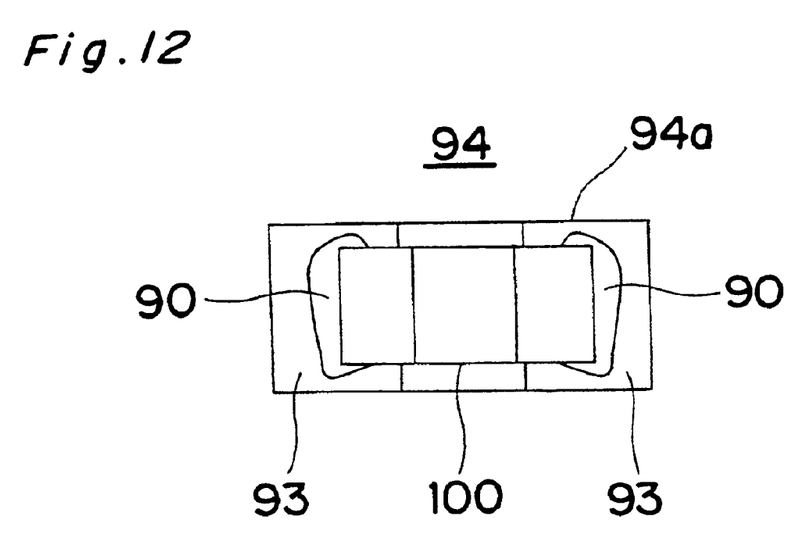
FIG. 12 is a view of a hollow portion of a resin block of the hologram laser as seen from above.

As shown in FIG. 11, capacitors 100 are housed in the hollow portion 94a of the resin block 94. FIG. 12 illustrates the hollow portion 94a as viewed from above. As is obvious from FIG. 12, the capacitors 100 are die bonded to exposed leads 93 with an Ag paste 90. The capacitors 100 are coated with a resin (not shown) and embedded in the resin block.

According to the hologram laser having the above constitution, since the capacitors 100 are die bonded to the leads 93, the distance from the capacitors 100 to the OPIC 96 becomes shorter compared with a case where the capacitors 100 are connected to the leads 93 by wires. As a result, power source noise is efficiently suppressed by the capacitors 100, thus making it possible to enhance the power source noise suppression effect.

The capacitors 100 are die bonded to the leads 93. In other words, it is not required to provide the capacitors 100, for example, on a flexible circuit board to be connected to the leads 93. This results in the expansion of the degree of freedom of design of the wiring pattern of the flexible circuit board.

Since it is not any more required to place the capacitors 100 on the flexible circuit board, it is possible to reduce the number of components to be fitted to the flexible board.

If the operation speed of the OPIC 96 is increased, power consumption of the OPIC 96 increases. However, because the distance from the capacitors to the OPIC 96 is short, the power source voltage for the OPIC 96 is stably maintained, making it possible to prevent the OPIC 96 from becoming unstable. That is, even if the operation speed of the OPIC 96 is increased, the OPIC 96 is allowed to operate stably.

Further, even if the operating voltage of the OPIC 96 is reduced, the operation of the OPIC 96 will hardly become unstable because the distance from the capacitors to the OPIC 96 is so short that the OPIC 96 is hardly affected by variations in the load.

Furthermore, because the distance from the capacitors to the OPIC 96 is short, it is not required to make the capacitance of the capacitors 100 large. Accordingly, a small capacitance of the capacitors 100 makes it possible to reduce the production cost.

Since the capacitors 100 are embedded in the resin block 94, the possibility that the capacitors 100 are broken and/or detached from the leads 93 by an external force is reduced. As a result, the following improvements are realized simultaneously: an improvement in the production yield; an improvement in the workability attributable to the fact that handling becomes easy; and an improvement in the reliability due to a decrease in the detachment of the capacitors 100.

The capacitors 100 are provided on the side opposite from the LD chip 95 relative to the metal block 92. Thus, heat applied at the time of die bonding the LD chip 95 with an Ag paste is hardly transferred to the capacitors 100. Therefore, the heat-resistance temperature of the Ag paste 90 and that of the capacitor protection-use resin can be lowered, which makes it easy to select materials and also leads to the cost reduction.

Next, an example of a process for producing the hologram laser will be described.

First, an electrode block 91 as shown in FIG. 9 is prepared. As described above, the electrode block 91 has a metal block 92 and leads 93 integrated through a resin block 94 into the electrode block. Also, the resin block 94 is formed with a hollow portion 94a for exposing the leads 93.

Next, the capacitors 100 are placed in the hollow portion 94a, and then the capacitors 100 are bonded to the leads 93 with the Ag paste 90.

Then, the capacitors 100 are coated with a resin so as to be embedded.

In this way, the capacitors 100 are housed in the hollow portion 94a that exposes certain leads 93, and the capacitors 100 are bonded to the exposed leads 93 with the Ag paste 90 in the hollow portion 94a. Therefore, the Ag paste 90 is prevented from spreading out when the Ag paste is applied or when the capacitors 100 are mounted. Accordingly, the Ag paste 90 is prevented from being applied even to leads 93 to which the Ag paste 90 should not be applied.

As to whether or not the leads 93 are short-circuited by the Ag paste 90, all that is required is to conduct a test only on the leads exposed from the hollow portion 94a. Thus, it is possible to simplify a device for the test.

Furthermore, since the capacitors 100 are coated with the resin, the environmental resistance is improved.

After the above process step, mounting of the other component parts is performed to complete a hologram laser as shown in FIGS. 9–11.

The hologram laser can be used as a light source for reading/writing a signal from/to an optical disc, such as a CD (compact disc), CD-R/RW (recordable or write-once CD/rewritable CD), DVD (digital versatile disc), DVD-R/RW (recordable or write-once DVD/rewritable DVD).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising:
   a semiconductor laser element;
   a photodetector detecting light originating from the semiconductor laser element;
   a capacitor connected to the photodetector; and
   a package housing the semiconductor laser element, the photodetector and the capacitor so that noise from a power source is suppressed.

2. The semiconductor laser device according to claim 1, wherein
   the photodetector is die bonded to a first die bonding surface of a mounting portion provided within the package;
   the capacitor is a wire-bondable chip capacitor, and is die bonded to a second die bonding surface of the mounting portion; and
   the first die bonding surface and the second die bonding surface are substantially parallel to each other.

3. The semiconductor laser device according to claim 2, further comprising a lead pin provided within the package and in proximity of the mounting portion and wherein
   the photodetector, the capacitor and the lead pin have respective wire bonding surfaces; and
   the wire bonding surfaces of the photodetector, the capacitor, and the lead pin are substantially parallel to one another, and the wire bonding surface of the capacitor is located between the wire bonding surface of the photodetector and the wire bonding surface of the lead pin.

4. The semiconductor laser device according to claim 2, wherein the first die bonding surface is a top surface of the mounting portion and the second die bonding surface is an intermediate surface located between the top surface of the mounting portion and a bottom surface of the mounting portion.

5. The semiconductor laser device according to claim 2, wherein
   the semiconductor laser element is die bonded to a die bonding surface of a submount fixed to the mounting portion; and
   the mounting portion has a surface that is substantially coplanar with the die bonding surface of the submount.

6. The semiconductor laser device according to claim 2, further comprising a wiring board on which the package is mounted.

7. The semiconductor laser device according of claim 2, wherein the chip capacitor is electrically connected to the photodetector by a wire.

8. The semiconductor laser device according of claim 2, wherein the photodiode is electrically connected to a power source device provided outside the package.

9. A method for producing a semiconductor laser device, comprising:
   providing a mounting portion having a first die bonding surface and a second die bonding surface that are substantially parallel to each other;
   mounting a semiconductor laser element on the mounting portion;
   die bonding a wire-bondable chip capacitor to the second die bonding surface of the mounting portion with an Ag paste;
   die bonding a photodetector to the first die bonding surface of the mounting portion with a resinous adhesive, the photodetector being configured to detect light originating from the semiconductor laser element;
   connecting the chip capacitor to the photodetector; and
   housing in a package the mounting portion having the semiconductor laser element thereon, the photodetector and the chip capacitor so that noise from a power source is suppressed.

10. The method for producing a semiconductor laser device according to claim 9, wherein the die bonding of the photodetector is performed after the die bonding of the chip capacitor.

11. A semiconductor laser device comprising:
    a metal block mounted with a laser chip;
    leads to serve as electrodes;
    a resin block though which the metal block and the leads are integrated into an electrode block;
    a capacitor electrically connected directly to the leads; and
    a photodetector connected to the capacitor,
    wherein the resin block has a hollow portion, and the capacitor is housed in the hollow portion and bonded to a part of the leads that are made accessible by the hollow portion.

12. The semiconductor laser device according to claim 11, wherein the capacitor is coated with a resin to be embedded in the hollow portion of the resin block with the resin.

13. The semiconductor laser device according to claim 11, wherein the capacitor is provided on a side opposite from the laser chip relative to the metal block.

14. A method for producing a semiconductor laser device, the semiconductor laser device having an electrode block constructed by integrating a metal block mounted with a laser chip and a photodetector, and leads to serve as electrodes through a resin block, said method comprising:
    forming the resin block with a hollow portion to expose the leads;
    placing a capacitor in the hollow portion and bonding the capacitor to the leads with an Ag paste so that the photodetector is connected to the capacitor; and
    coating the capacitor with a resin to thereby embed the capacitor in the resin.

15. A method for producing a semiconductor laser device, comprising:
    preparing an electrode block wherein a metal block mounted with a laser chip and a photodetector is integrated with leads through a resin block, the resin block being formed with a hollow portion exposing some of the leads;
    placing a capacitor in the hollow portion and bonding the capacitor to the exposed leads with an Ag paste so that the photodetector is connected to the capacitor; and
    coating the capacitor with a resin to thereby embed the capacitor in the resin.

* * * * *